(12) United States Patent
Tao et al.

(10) Patent No.: US 7,151,308 B2
(45) Date of Patent: Dec. 19, 2006

(54) SEMICONDUCTOR CHIP PACKAGE

(75) Inventors: Su Tao, Kaohsiung (TW); Shih Chang Lee, Kaohsiung County (TW)

(73) Assignee: Advanced Semiconductor Engineering, Inc. (TW)

( * ) Notice: Subject to any disclaimer, the term of this patent is extended or adjusted under 35 U.S.C. 154(b) by 180 days.

(21) Appl. No.: 10/791,896

(22) Filed: Mar. 4, 2004

(65) Prior Publication Data

US 2004/0175862 A1 Sep. 9, 2004

(30) Foreign Application Priority Data

Mar. 5, 2003 (TW) ............................. 92104882 A (51) Int. Cl.
*H01L 23/58* (2006.01)
(52) U.S. Cl. .......... 257/683; 257/E23.81; 257/E23.194
(58) Field of Classification Search ................ 257/683, 257/E23.004, E23.194, E23.181
See application file for complete search history.

(56) References Cited

U.S. PATENT DOCUMENTS

| | | | |
|---|---|---|---|
| 6,710,457 B1 * | 3/2004 | Silverbrook | 257/778 |
| 6,720,647 B1 * | 4/2004 | Fukuizumi | 257/704 |
| 2003/0071353 A1 * | 4/2003 | Noguchi | 257/737 |
| 2003/0146508 A1 * | 8/2003 | Chen et al. | 257/738 |
| 2005/0078434 A1 * | 4/2005 | Ho | 361/329 |

FOREIGN PATENT DOCUMENTS

JP     2000100866 A  *  4/2000

\* cited by examiner

*Primary Examiner*—Carl Whitehead, Jr.
*Assistant Examiner*—Jennifer M Dolan (57) ABSTRACT

A semiconductor chip package includes an interconnection substrate, a central substrate, a peripheral substrate and a semiconductor chip sandwiched between the interconnection substrate and the central substrate. The interconnection substrate has a recessed cavity for receiving the semiconductor chip. The peripheral substrate is separated from the central substrate thereby decreasing the stresses caused by CTE mismatch of the semiconductor chip package. Furthermore, both the central substrate and the peripheral substrate are mechanically and electrically connected to the interconnection substrate such that the semiconductor chip is electrically connected to the peripheral substrate through the central substrate and the interconnection substrate.

6 Claims, 10 Drawing Sheets

SEMICONDUCTOR CHIP PACKAGE

BACKGROUND OF THE INVENTION

1. Field of the Invention

This invention generally relates to a semiconductor chip package and the method for making the same.

2. Description of the Related Art

Integrated circuit (chip) packaging technology is becoming a limiting factor for the development in packaged integrated circuits of higher performance. Semiconductor package designers are struggling to keep pace with the increase in pin count, size limitations, low profile mounting constraints, and other evolving requirements for packaging and mounting integrated circuits. Currently, the common packaging and package mounting technology is a ball grid array (BGA) package, in which an array of solder pads for solder balls are formed on the integrated circuit package. Conductive leads or traces on the package connect the solder pads to wire bonding pads for electrically connection to the integrated circuit chip within the package. A corresponding array of solder pads is formed on a printed circuit board (PCB) on which the packaged integrated circuit is to be mounted and connected. Solder balls are formed on the solder pads of either the package or the printed circuit board (PCB), and then heated to a temperature sufficient to melt (reflow) the solder balls so as to solder the package to the printed circuit board (PCB).

Any BGA package that utilizes solder balls to electrically couple the packaged integrated circuit to a main PCB is susceptible to failure, particularly fatigue failure, due to temperature fluctuations and dissimilarity in thermal expansion rates for the components that form the BGA package. Specifically, as the BGA package cools down from the solder reflow temperature or undergoes ambient temperature changes during use, the BGA package experiences thermal deformation of different rates in different portions, thereby stressing and straining solder balls. The stresses are concentrated at the interfaces between the solder balls and the solder pads. Especially, as the pin count grows, the distance between the center and the farthest solder ball of the package, the "distance to the neutral point" (DNP), grows longer and thus the stresses on these outer solder balls cause cracking during thermal cycling.

Furthermore, electrical current flowing through the BGA package during operation causes the BGA package to cyclically or intermittently heat up and cool down, which results in additional thermal expansion and contraction, nevertheless such thermal expansion and contraction is considerably less than those at reflow. The stresses from the cyclical or intermittent heating and cooling of the BGA package during normal operation may lead to fatigue failure of the BGA package if the stresses are not properly released.

SUMMARY OF THE INVENTION

It is an object of the present invention to provide a high-pin-count BGA package which allows the stresses on the solder balls located in the periphery of the package resulted from CTE mismatch to be significantly decreased thereby ensuring the solder joint reliability thereof.

It is another object of the present invention to provide a semiconductor chip package with high heat-dissipation efficiency such that the heat generated from the semiconductor chip can be dissipated into the external environment thereby reducing the fatigue failure of the package.

A semiconductor chip package in accordance with the present invention mainly includes an interconnection substrate, a peripheral substrate with an opening, a central substrate disposed in the opening of the peripheral substrate, a semiconductor chip sandwiched between the interconnection substrate and the central substrate, and a plurality of solder balls respectively disposed on the bottom surfaces of the central substrate and the peripheral substrate. The interconnection substrate has a recessed cavity for receiving the semiconductor chip. The present invention is characterized in that the peripheral substrate is substantially separated from the central substrate thereby decreasing the stresses on the package due to CTE mismatch of the semiconductor chip package.

Specifically, the central substrate is provided with a plurality of first and second contact pads on the top surface thereof. The first contact pads are used for mechanically and electrically connecting to the semiconductor chip, and the second contact pads are used for electrically connecting to the first contact pads. The central substrate is provided with a plurality of central solder balls on the bottom surface thereof, wherein the central solder balls are electrically connected to the first contact pads through conductive traces provided on the central substrate.

Another feature of the present invention is that the central substrate and the peripheral substrate are both mechanically and electrically connected to the interconnection substrate by a plurality of solder balls. Therefore, the semiconductor chip can be electrically connected to the solder balls on the bottom surface of the peripheral substrate through the central substrate and the interconnection substrate. Specifically, the peripheral substrate is provided with a plurality of contact pads on the top surface thereof, and the solder balls on the bottom surface of the peripheral substrate are electrically connected to the semiconductor chip through the contact pads of the peripheral substrate and the second contact pads of the central substrate.

The interconnection substrate of the present invention may include a top plate, preferably a heat-sink, and a dielectric layer. The dielectric layer has an opening corresponding to the recessed cavity of the interconnection substrate, and a plurality of contact pads is formed on the bottom surface of the dielectric layer. The dielectric layer is securely attached to the top plate to form the aforementioned interconnection substrate with the recessed cavity. In the present invention, the semiconductor chip is disposed in the recessed cavity of the interconnection substrate and securely attached to the bottom of the recessed cavity thereby forming a cavity-down package with high heat-dissipation. Besides, the semiconductor chip of the present invention is connected to the central substrate by flip-chip bonding.

The present invention further provides a method for manufacturing the semiconductor chip package. First, a semiconductor chip is mechanically and electrically connected to a top surface of a main substrate. Then the semiconductor chip is securely attached to a recessed cavity of an interconnection substrate and the main substrate is mechanically and electrically connected to the interconnection substrate. Finally, the main substrate is cut to form a central substrate and a peripheral substrate, wherein the semiconductor chip is disposed on the central substrate. Preferably, the main substrate has been provided with a plurality of solder balls before the cutting step. According to one embodiment of the present invention, the bottom surface of the main substrate is provided with a plurality of solder balls after the semiconductor chip is connected to the main substrate and before the semiconductor chip is securely attached to the interconnection substrate.

According to another embodiment of the present invention, the bottom surface of the interconnection substrate is provided with a plurality of solder balls on the contact pads around the recessed cavity before the step of connecting the semiconductor chip to the main substrate. The step of connecting the main substrate to the interconnection substrate is conducted by reflowing the solder balls.

The peripheral solder balls of the semiconductor chip package according to the present invention are disposed on the peripheral substrate separated from the central substrate. Therefore, the stresses on the package (especially on the peripheral solder balls) due to CTE mismatch between components of the package can be released. Additionally, the solder balls on the peripheral substrate can be electrically connected to the semiconductor chip through the interconnection substrate and the central substrate. Therefore, the separation of the peripheral substrate from the central substrate won't limit the number of the solder balls of the package available for external connections.

The semiconductor chip package of the present invention utilizes a cavity-down structure which includes a semiconductor chip with its backside surface directly bonded to an interconnection substrate with high heat-dissipation efficiency. Therefore, the heat generated during the operation of the chip can be quickly dissipated out of the package thereby reducing the stresses on the package due to the temperature fluctuation.

The present invention further provides a semiconductor chip package and a substrate for use therein. The package includes a substrate, a chip disposed on a top surface of a substrate and a plurality of central solder balls and peripheral solder balls disposed on the bottom surface of the substrate. The substrate includes a plurality of chip bonding pads disposed on the top surface of the substrate for electrically connecting to the semiconductor chip. Besides, the substrate includes a plurality of central contact pads and peripheral contact pads disposed on the bottom surface of the substrate, and a plurality of slots disposed between the central contact pads and the peripheral contact pads for separating the central contact pads and the peripheral contact pads. The central contact pads are electrically connected to the chip bonding pads. The peripheral contact pads are preferably connected to the chip bonding pads. The central solder balls of the package are disposed on the central contact pads, and the peripheral solder balls are disposed on the peripheral contact pads. Although the aformentioned substrate is not completely divided into two separate substrates, the slots on the substrate can act as a buffer area between the central solder balls and the peripheral solder balls thereby helping to reduce the stresses due to the temperature fluctuation.

Other objects, advantages, and novel features of the invention will become more apparent from the following detailed description when taken in conjunction with the accompanying drawings.

BRIEF DESCRIPTION OF THE DRAWINGS

FIG. 6b is a top plan view of the substrate of FIG. 6a; and

DETAILED DESCRIPTION OF THE PREFERRED EMBODIMENTS

Figure 1:
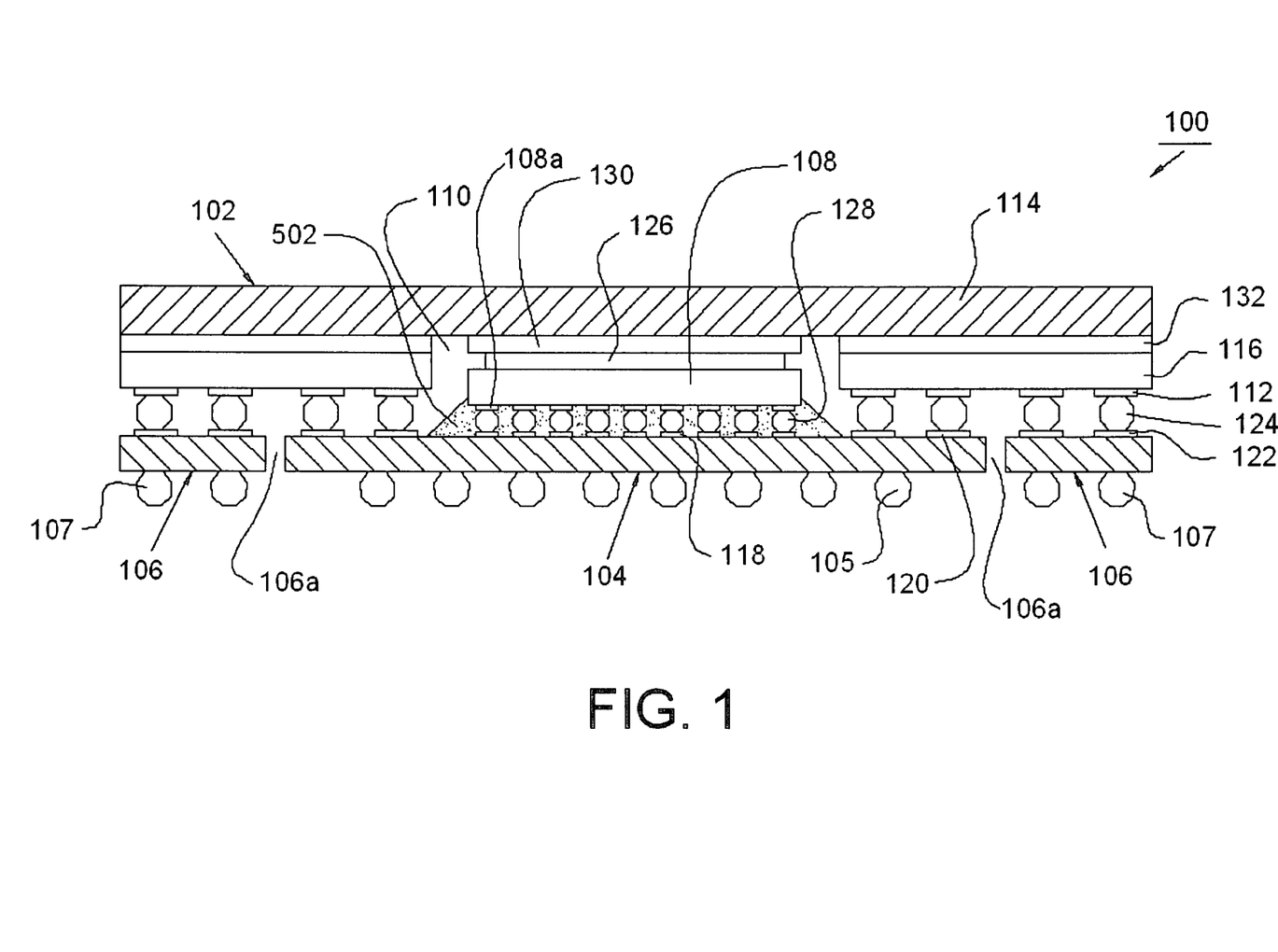
FIG. 1 is a cross sectional view of a semiconductor chip package according to one embodiment of the present invention.

FIG. 1 illustrates a semiconductor chip package 100 according to one embodiment of the present invention. The semiconductor chip package 100 generally includes an interconnection substrate 102, a central substrate 104, a peripheral substrate 106, a semiconductor chip 108, a plurality of central solder balls 105 disposed on the bottom surface of the central substrate 104 and a plurality of peripheral solder balls 107 disposed on the bottom surface of the peripheral substrate 106. The peripheral substrate 106 has an opening 106a, and the central substrate 104 is disposed in the opening 106a of the peripheral substrate and substantially coplanar with the peripheral substrate 106.

The bottom surface of the interconnection substrate 102 has a recessed cavity 110 defined therein and a plurality of contact pads 112 formed around the recessed cavity 110. The interconnection substrate 102 may include a top plate 114, preferably a heat-sink, and a dielectric layer 116. The dielectric layer 116 has an opening corresponding to the recessed cavity 110, and a plurality of contact pads 112 and conductive traces (not shown) for interconnecting the contact pads 112 are formed on the bottom surface of the dielectric layer 116. The dielectric layer 116 is securely attached to the top plate 114 to form the aforementioned interconnection substrate 102 with the recessed cavity 110.

The central substrate 104 has a plurality of contact pads 118 and 120 on the top surface thereof. The contact pads 118 are divided into two groups. The first group is directly electrically connected to the central solder balls 105 through conductive traces (not shown) provided on the central substrate 104. The second group is electrically connected to corresponding contact pads 120 through conductive traces (not shown) provided on the central substrate 104.

The peripheral substrate 106 is separated from the central substrate 104 and has contact pads 122 on the top surface thereof.

In the FIG. 1, the interconnection substrate 102 is secured and electrically connected to the central substrate 104 and the peripheral substrate 106 by solder balls 124. However, in addition to solder balls, column-like solder bumps or anisotropic conductive adhesive film may be utilized for connecting the interconnection substrate 102 to the central 104 and the peripheral substrate 106.

The semiconductor chip 108 is disposed in the recessed cavity 110 of the interconnection substrate 102 and securely attached to the bottom surface of the interconnection substrate 102 by an adhesive layer 126. The semiconductor chip 108 is mechanically and electrically connected to the central substrate 104 by flip-chip bonding (such as by a plurality of solder balls 128) thereby directly electrically connecting the bonding pads 108a of the semiconductor chip 108 to the contact pads 118 of the central substrate 104.

Besides, if the thickness of the semiconductor chip 108 is smaller than the minimum distance between the top plate 114 of the interconnection substrate 102 and the central substrate 104, the package 100 may further include a metal plate 130 sandwiched between the interconnection substrate 102 and the chip 108.

The peripheral solder balls 107 are disposed on the bottom surface of the peripheral substrate 106, and electrically connected to corresponding contact pads 122 through conductive traces (not shown) provided on the peripheral substrate 106, then electrically connected to corresponding contact pads 120 on the central substrate 104 through the solder balls 124, the contact pads 112 and conductive traces (not shown) provided on the interconnection substrate 102, and finally electrically connected to the semiconductor chip 108 through the conductive traces (not shown) on the central substrate 104 and the second group of contact pads 118.

The peripheral solder balls of the semiconductor chip package according to the present invention are disposed on the peripheral substrate separated from the central substrate on which the central solder balls are provided. Therefore, the stresses on the package (especially on the peripheral solder balls) due to CTE mismatch between components of the package can be released. Additionally, the solder balls on the peripheral substrate can be electrically connected to the semiconductor chip through the interconnection substrate and the central substrate. Therefore, the separation of the peripheral substrate from the central substrate won't limit the number of the solder balls of the package available for external connections.

The semiconductor chip package of the present invention utilizes a cavity-down structure which includes a semiconductor chip with its backside surface directly bonded to an interconnection substrate with high heat-dissipation efficiency. Therefore, the heat generated during the operation of the chip can be quickly dissipated out of the package thereby reducing the stresses on the package due to the temperature fluctuation.

Figure 2:
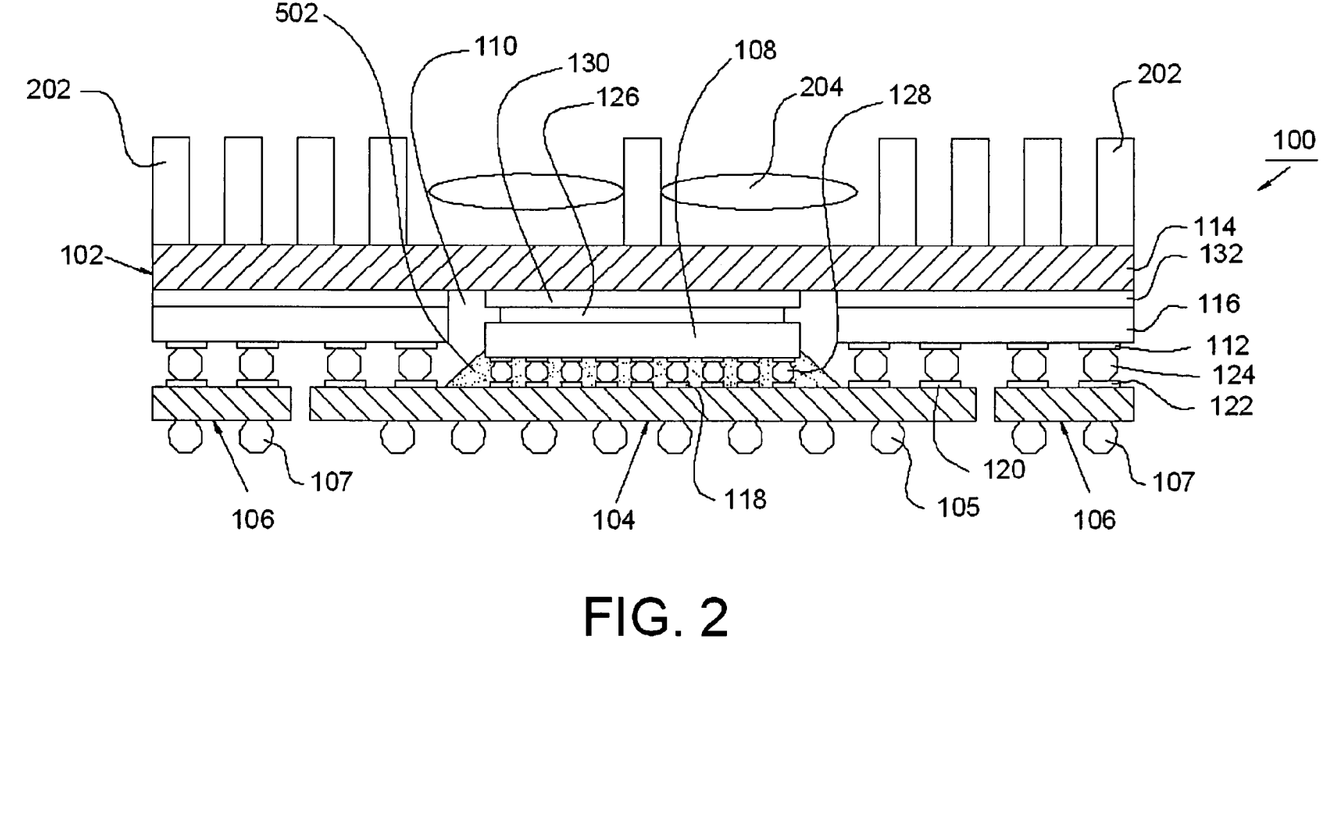
FIG. 2 is a cross sectional view of a semiconductor chip package according to another embodiment of the present invention.

In order to further increase the heat dissipation efficiency of the semiconductor chip package, as shown in FIG. 2, a finned heat-sink 202 or a fan 204 may also be provided on the top plate of the semiconductor chip package 100.

Figure 3A:
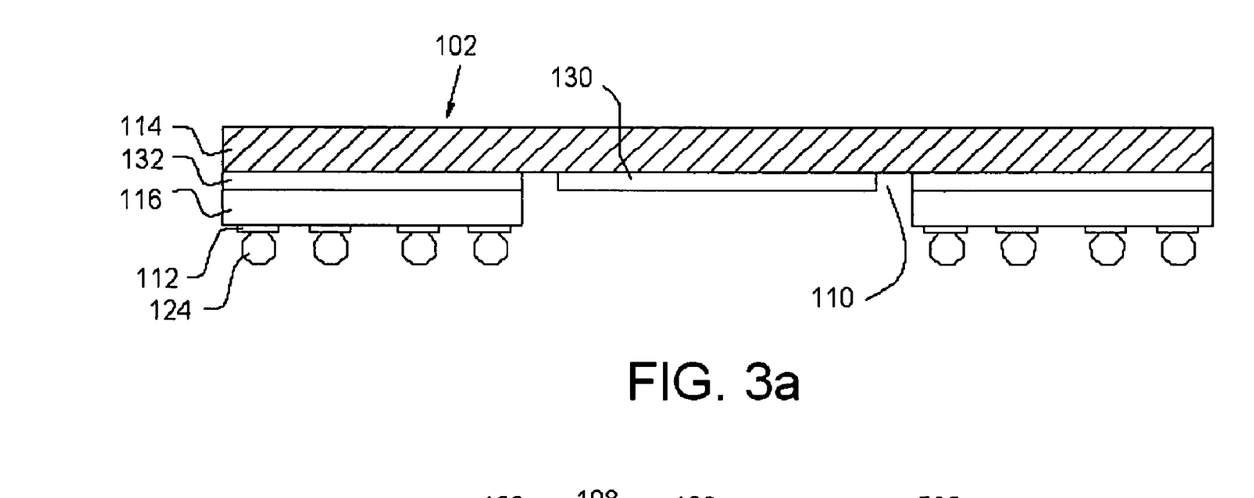
FIGS. 3a–3c illustrate, in cross sectional view, the major steps of a method for manufacturing a semiconductor chip package according to one embodiment of the present invention.

The present invention further provides a method for manufacturing the aforementioned semiconductor chip package. First, referring to FIG. 3a, a plurality of solder balls 124 are formed on a plurality of contact pads 112 of an interconnection substrate 102. Then, referring to FIG. 3b, a semiconductor chip 108 which has been mechanically and electrically connected to a main substrate 300 is bonded onto the interconnection substrate 102 by an adhesive layer 126. The main substrate 300 which is connected to the chip 108 is disposed under the interconnection substrate 102. Preferably, the bottom surface of the main substrate 300 has been provided with a plurality of central solder balls 105 and peripheral solder balls 107. Next, the main substrate 300 is mechanically and electrically connected to the interconnection substrate 102. Preferably, the main substrate 300 is connected to the interconnection substrate 102 by reflowing the solder balls 124. Finally, the main substrate 300 is cut to form a central substrate 104 and a peripheral substrate 106 (see FIG. 3c) which are separated from each other. It should be noted that, the cutting step may be conducted by forming a plurality of slots in the main substrate 300 such that only a portion of the central substrate 104 is connected to the peripheral substrate 106.

Figure 4A:
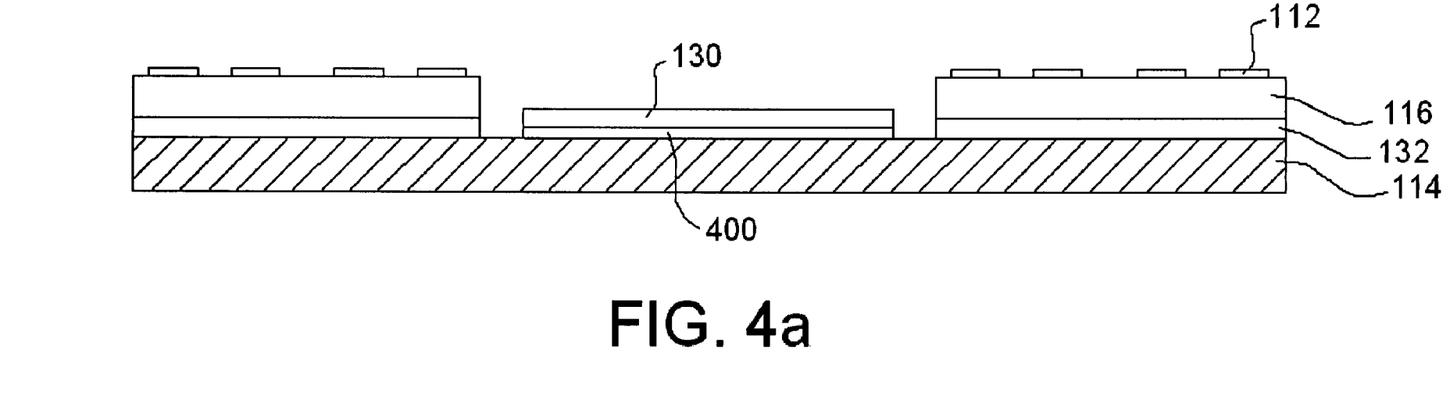
FIGS. 4a–4b illustrate the main steps of a method for manufacturing the interconnection substrate according to one embodiment of the present invention in cross sectional views.
Figure 4B:
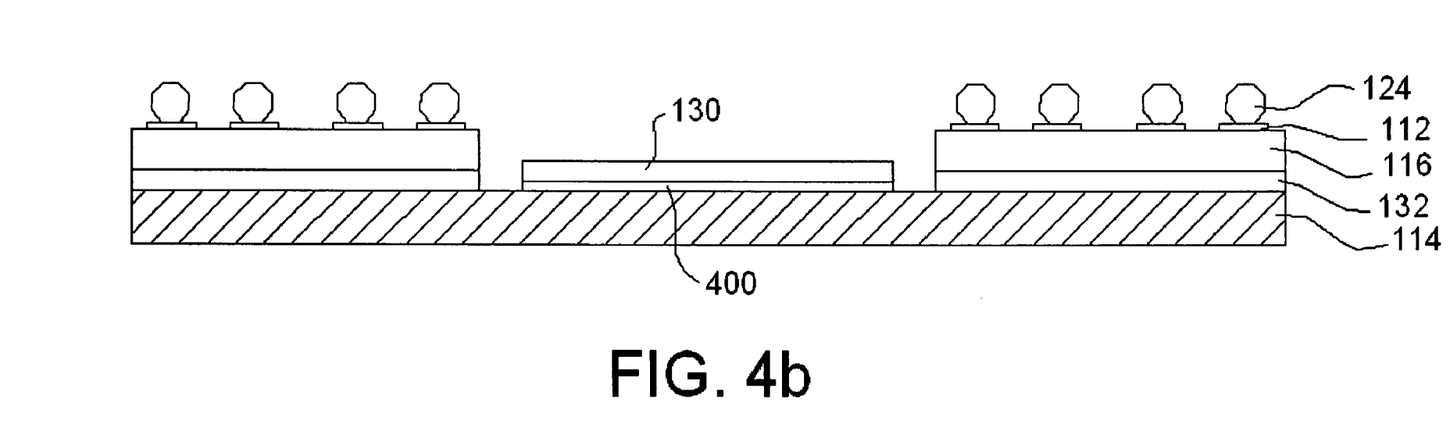

Referring to FIG. 4a, the manufacturing process of the interconnection 102 includes a step of attaching the dielectric layer 116 to the bottom surface of the top plate 114, such as a heat-sink, through a nonconductive adhesive 132 such as TSA-61 nonconductive adhesive commercially available from Toray Company. The bottom surface of the dielectric layer 116 is provided with a plurality of contact pads 112. The surface of the contact pad 112 is preferably provided with a layer of organic solderability preservative or plated with a layer of nickel thereon and then plated with a gold on the nickel layer in order to protect the surface of the contact pad 112 from corrosion or contamination thereby ensuring the solder-joint reliability between the contact pads and the solder balls. Besides, a metal plate 130 can be attached to the bottom of the heat-sink 114 through a thermal conductive adhesive 400. Then referring to the FIG. 4b, the contact pads 112 are screen printed with solder paste to form the solder balls 124.

Figure 3B:
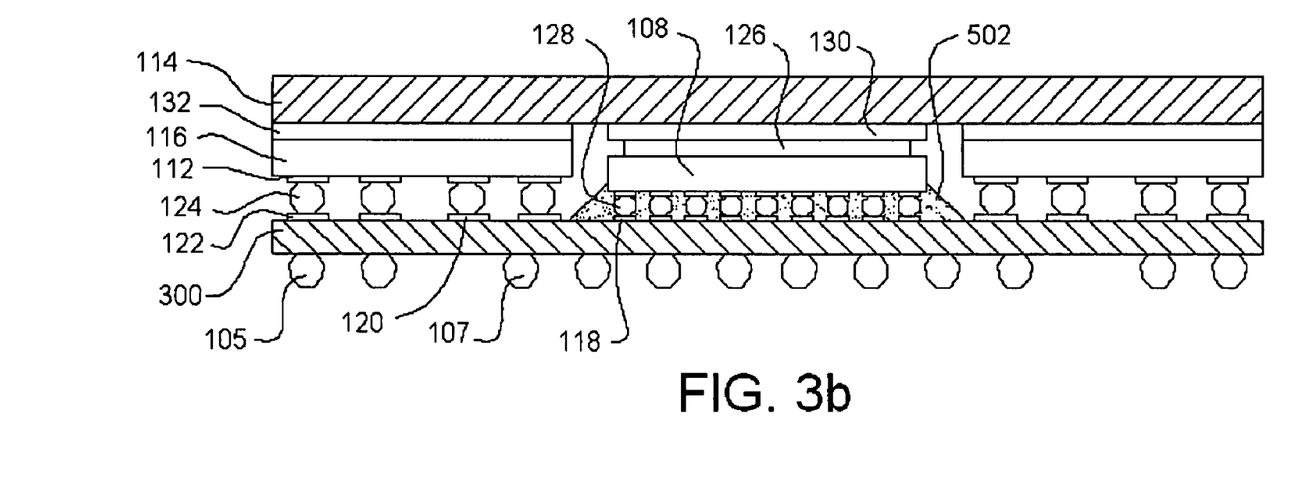
Figure 3C:
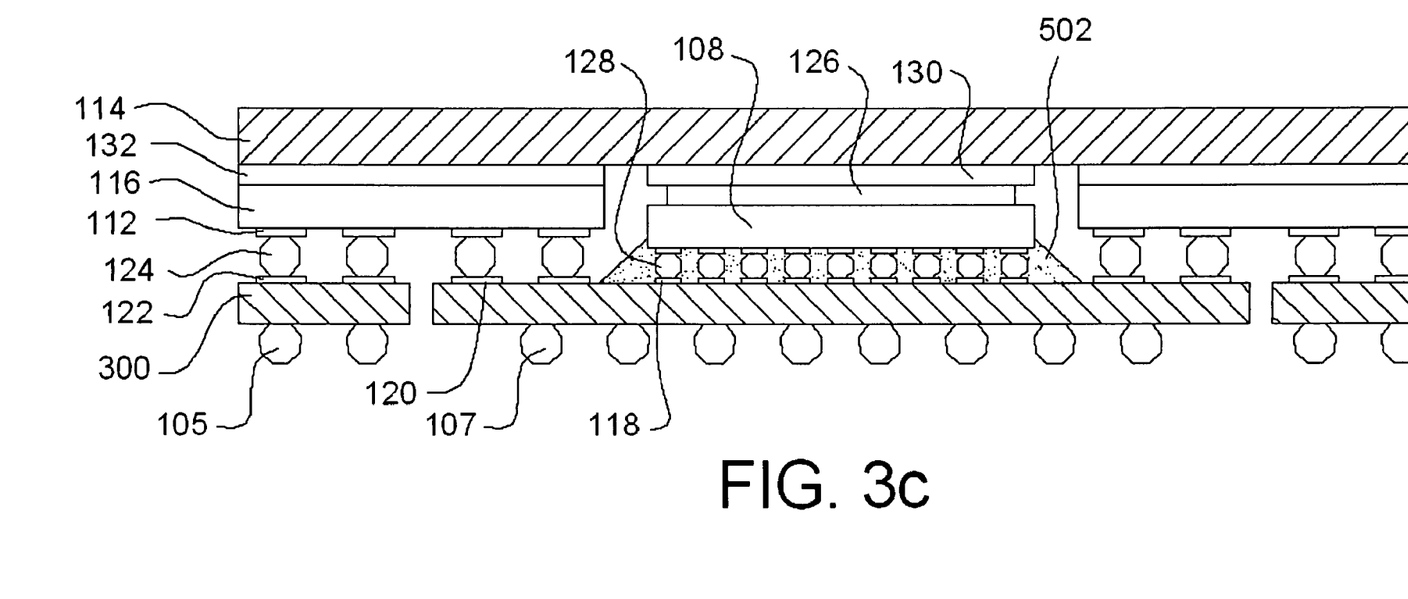

Referring to FIG. 3b, in the step of securing the chip 108 to the interconnection substrate 102, an elastomeric material such as silicone adhesive or flexible epoxy is suitable to be used for connecting the chip 108 to the interconnection substrate 102. A suitable silicone adhesive is TC3280G commercially available from General Electric Company. A suitable flexible epoxy is ABLEBOND® P1-8971 commercially available from Ablestick Laboratories. The elastomeric material may be applied in a fluid condition and then cured to a resilient layer. Therefor, the adhesive layer 126 helps to absorb the stresses due to CTE (coefficient of thermal expansion) mismatch between the semiconductor chip 108 and the interconnection substrate 102.

Figure 5A:
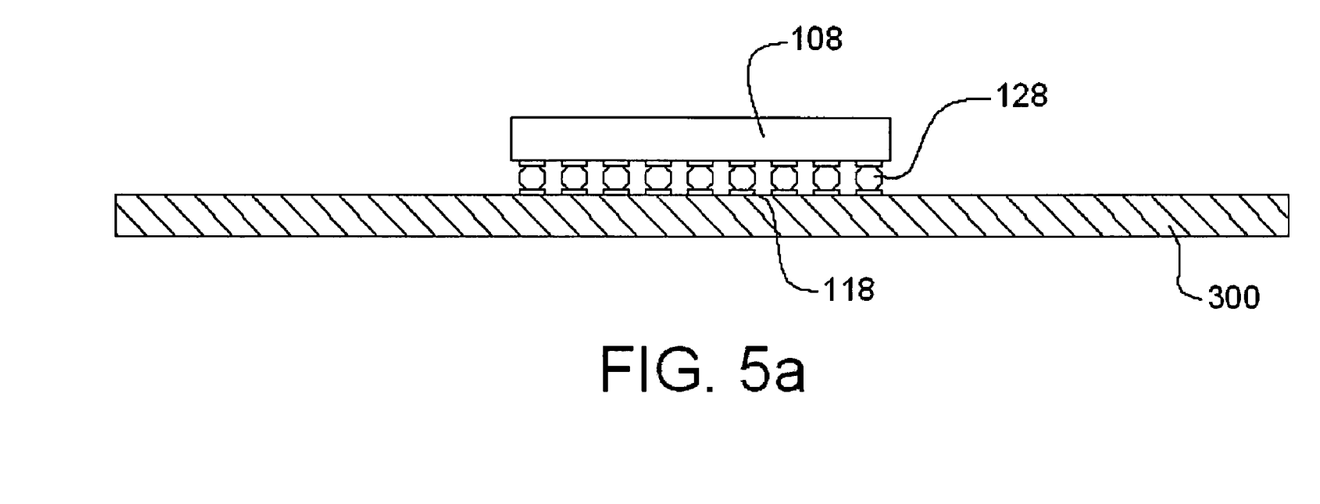
FIGS. 5a–5c illustrate the main steps of a method for attaching the semiconductor chip to the substrate and forming a the solder balls on the substrate in cross sectional views.
Figure 5B:
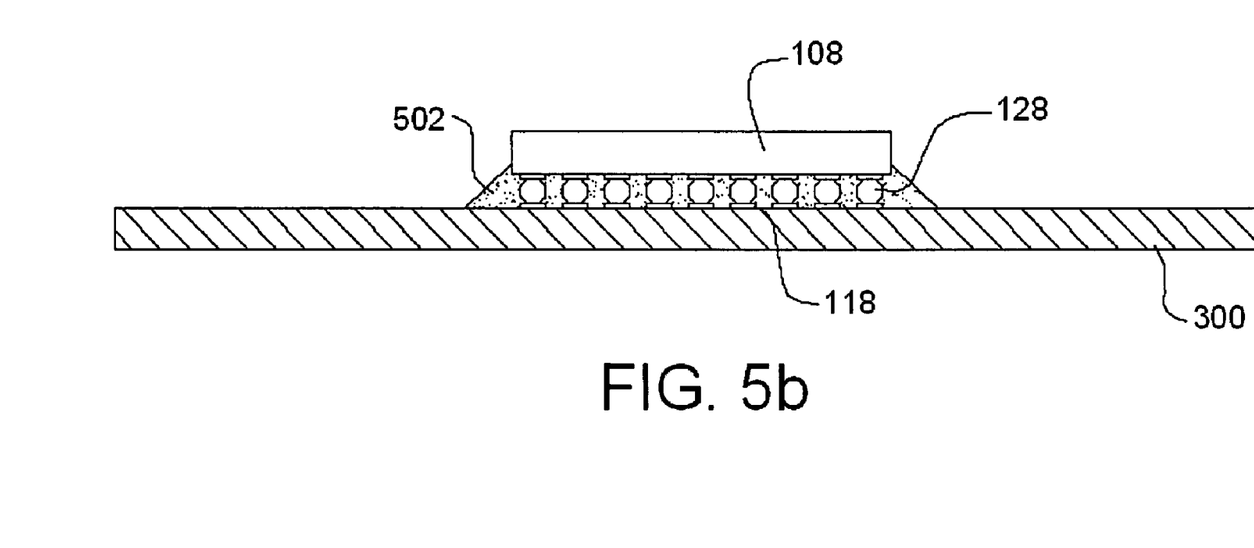
Figure 5C:
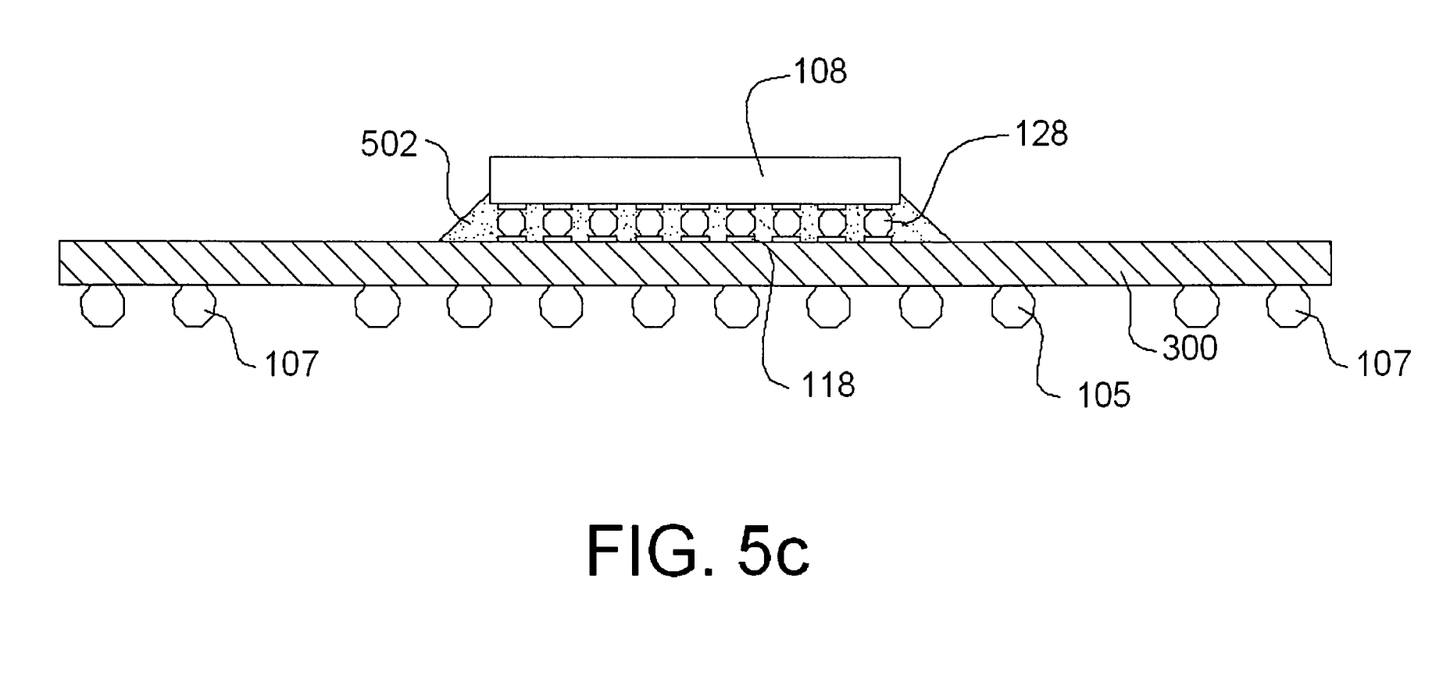

FIGS. 5a–5c illustrate a method for connecting the chip 108 to the substrate 300 by flip-chip bonding. First, referring to FIG. 5a, the chip 108 provided with a plurality of solder bumps is connected to the substrate 300 by reflowing. The surface of the contact pads 118 for connecting with the small solder balls 128 is preferably provided with a layer of organic solderability preservative or plated with a layer of nickel thereon and then plated with a gold on the nickel layer. The gap between the chip 108 and the substrate 300 is sealed by an underfill 502 thereby strengthening and stabilizing the interconnection between the chip 108 and the substrate 300 and increasing the solder joint reliability between the chip 108 and the substrate 300. In the present invention, the underfill 502 is made of a material with good thermoconductivity whereby the heat generated from the chip 108 during normal operation can be rapidly conducted to the central substrate 104, and then dissipated to outside environment through the central solder balls 105. Preferably, the underfill 502 has a CTE matching that of the small solder balls 128 whereby the underfill 502 can help to immobilize the solder balls 128 as well as absorb stresses created as temperature changes. Finally, referring to FIG. 5c, a plurality of central solder balls 105 and peripheral solder balls 107 are formed on the substrate 300.

Figure 6A:
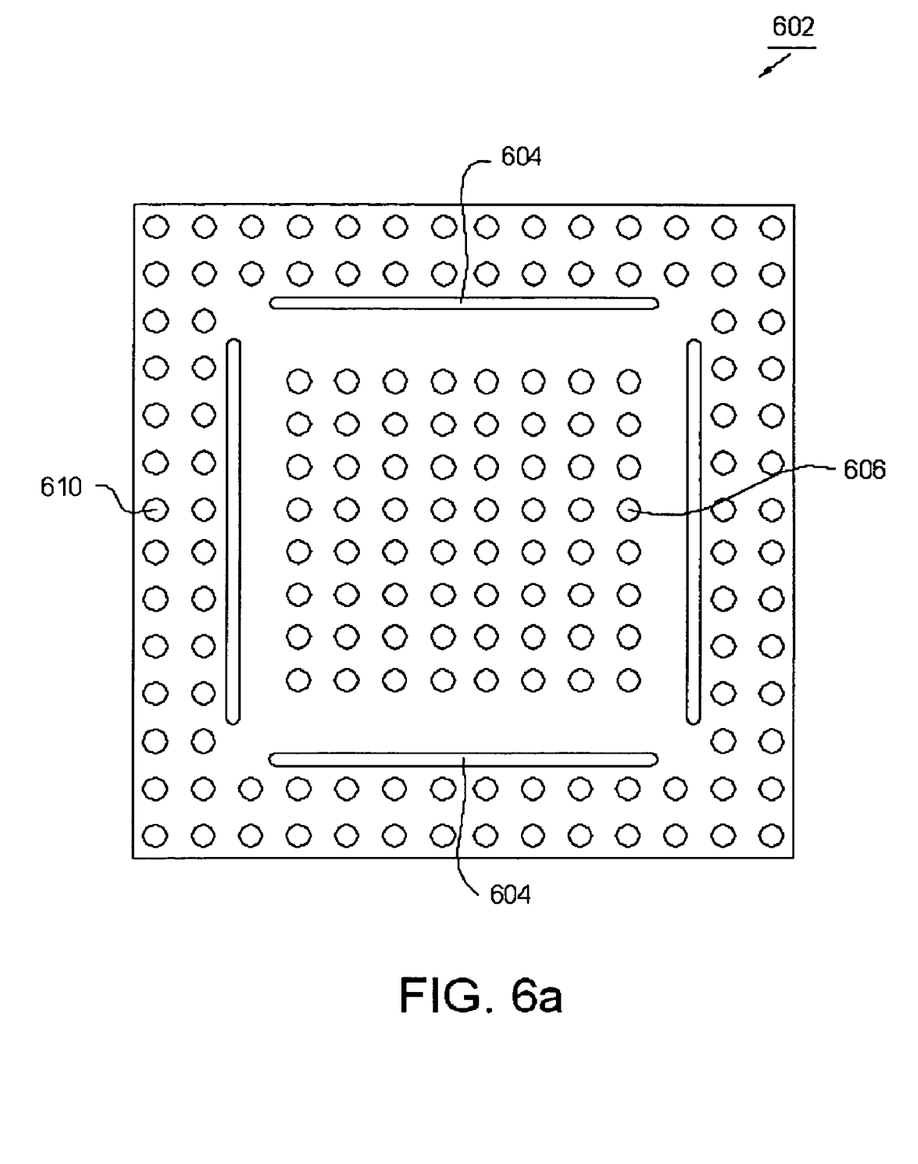
FIG. 6a is a bottom plan view of a substrate used in the semiconductor chip package according to one embodiment of the present invention.
Figure 6B:
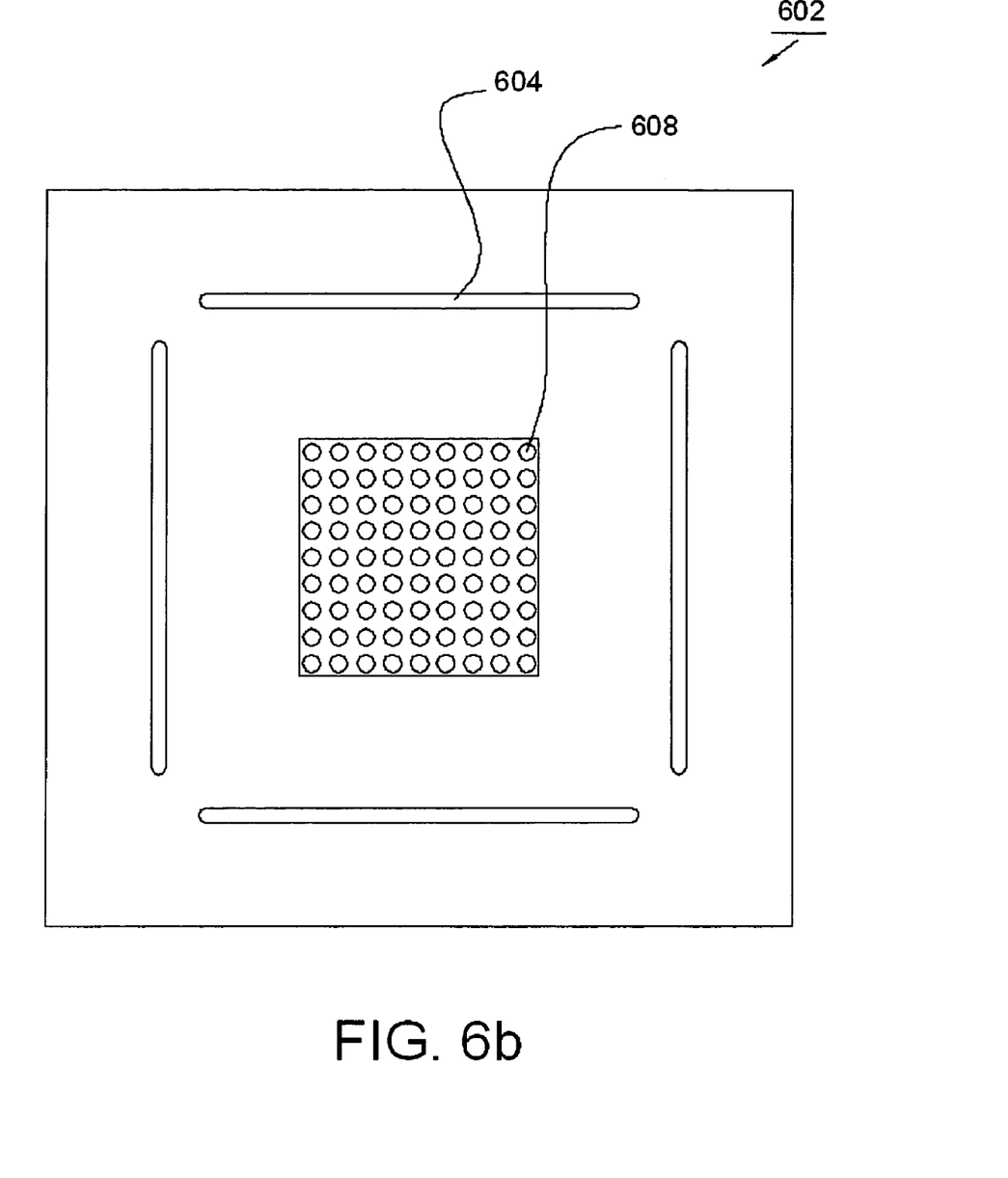
Figure 7:
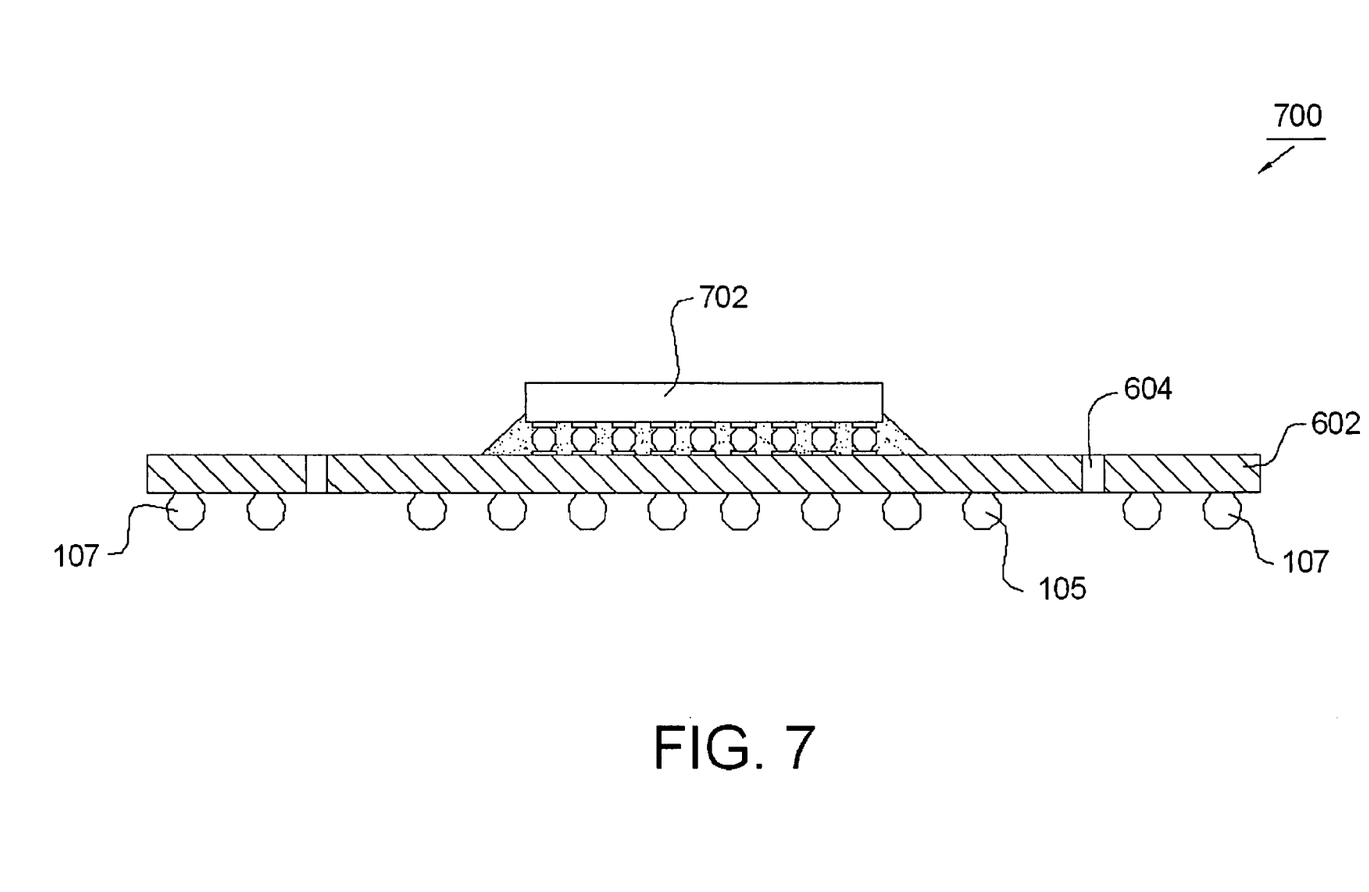
FIG. 7 is a cross sectional view of a semiconductor chip package according to another embodiment of the present invention.

The present invention further provides a semiconductor chip package as shown in FIG. 7. The package 700 includes a chip 702 disposed on a top surface of a substrate 602 and a plurality of central solder ball 105 and peripheral solder balls 107 disposed on the bottom surface of the substrate 602. The substrate 602 includes a plurality of chip bonding pads 608 (see FIG. 6b) disposed on the top surface of the substrate 602 for electrically connecting to the semiconductor chip 702. Besides, the substrate 602 includes a plurality of central contact pads 606 and peripheral contact pads 610 disposed on the bottom surface of the substrate 602 (see FIG. 6a). The central contact pads are electrically connected to the chip bonding pads 608. The peripheral contact pads 610 are preferably connected to the chip bonding pads 608 through the circuit layout on the substrate 602. The substrate is characterized by having a plurality of slots 604 disposed between the central contact pads 606 and the peripheral contact pads 610 for separating the central contact pads 606 and the peripheral contact pads 610. The central solder balls 105 of the package 700 are disposed on the central contact pads 606, and the peripheral solder balls 107 are disposed on the peripheral contact pads 610. The chip 702 may be disposed on the substrate 602 by flip-chip bonding or wire bonding. Although the substrate 602 of the package 700 is not completely divided into two separate substrates, the slots on the substrate can act as a buffer area between the central solder balls 105 and the peripheral solder balls 107 thereby helping to reduce the stresses due to the temperature fluctuation. It should be understood that the substrate 602 can be customized to interconnect the chip 108 and the interconnection substrate 102 thereby obtaining a package similar to the package 100 shown in FIG. 1.

Although the invention has been explained in relation to its preferred embodiments, it is to be understood that many other possible modifications and variations can be made without departing from the spirit and scope of the invention as hereinafter claimed. For example, the heat sink is illustrated in the embodiments as a finned heat sink, however, other heat sink configurations such as pinned, staggered pins or offset-strip fins may be utilized.

What is claimed is:

1. A semiconductor chip package, comprising:
    an interconnection substrate;
    a peripheral substrate having an opening;
    a central substrate being disposed in the opening of the peripheral substrate and substantially coplanar with the peripheral substrate, wherein the central substrate and the peripheral substrate are mechanically and electrically connected to the interconnection substrate;
    a semiconductor chip sandwiched between the interconnection substrate and the central substrate, the interconnection substrate having a recessed cavity for receiving the semiconductor chip;
    a plurality of central solder balls disposed on a bottom surface of the central substrate and electrically connected to the semiconductor chip; and
    a plurality of peripheral solder balls disposed on a bottom surface of the peripheral substrate and electrically connected to the semiconductor chip through the interconnection substrate;
    wherein
    the peripheral substrate is substantially separated from the central substrate thereby decreasing the stresses on the peripheral substrate due to coefficient of thermal expansion mismatch; and
    the central substrate and the peripheral substrate are completely separated from each other.

2. The semiconductor chip package as claimed in claim 1, wherein
    the interconnection substrate has a bottom surface provided with a plurality of contact pads around the recessed cavity;
    the central substrate has a top surface provided with a plurality of first and second contact pads, wherein the second contact pads are electrically connected to the first contact pads;
    the peripheral substrate has a top surface provided with a plurality of contact pads;
    the semiconductor chip is provided with a plurality of bonding pads and disposed on the top surface of the central substrate by flip-chip bonding such that the bonding pads of the semiconductor chip are electrically connected to the first contact pads of the central substrate;
    the central solder balls are electrically connected to the bonding pads of the semiconductor chip through the first contact pads of the central substrate; and
    the peripheral solder balls are electrically connected to the semiconductor chip through the contact pads of the peripheral substrate and the second contact pads of the central substrate.

3. The semiconductor chip package as claimed in claim 1, wherein the interconnection substrate comprises a top plate and a dielectric layer securely attached to the top plate, and the dielectric layer has an opening integrated with the top plate to form the recessed cavity of the interconnection substrate.

4. The semiconductor chip package as claimed in claim 3, wherein the top plate of the interconnection substrate comprises a heat-sink.

5. The semiconductor chip package as claimed in claim 1, further comprising a metal plate sandwiched between the semiconductor chip and the interconnection substrate.

6. The semiconductor chip package as claimed in claim 1, wherein the central substrate and the peripheral substrate are mechanically and electrically connected to the interconnection substrate by a plurality of solder balls.

\* \* \* \* \*